(12) United States Patent
Karbassi et al.

(10) Patent No.: US 9,479,200 B2
(45) Date of Patent: Oct. 25, 2016

(54) ULTRA-BROADBAND PROGRAMMABLE HYBRID STEP ATTENUATOR

(71) Applicant: NATIONAL INSTRUMENTS CORPORATION, Austin, TX (US)

(72) Inventors: Abdolreza Karbassi, San Francisco, CA (US); Tamir E. Moran, Petaluma, CA (US)

(73) Assignee: NATIONAL INSTRUMENTS CORPORATION, Austin, TX (US)

( * ) Notice: Subject to any disclaimer, the term of this patent is extended or adjusted under 35 U.S.C. 154(b) by 324 days.

(21) Appl. No.: 14/192,732

(22) Filed: Feb. 27, 2014

(65) Prior Publication Data

US 2015/0244399 A1    Aug. 27, 2015

(51) Int. Cl.
*H04L 5/08* (2006.01)
*H04B 1/00* (2006.01)
*H03H 7/24* (2006.01)
*H03H 7/00* (2006.01)

(52) U.S. Cl.
CPC .............. *H04B 1/0057* (2013.01); *H03H 7/24* (2013.01); *H03H 2007/006* (2013.01)

(58) Field of Classification Search
CPC .................................. H04L 5/08; H04L 5/14
See application file for complete search history.

(56) References Cited

U.S. PATENT DOCUMENTS

| | | | | |
|---|---|---|---|---|
| 4,227,259 A | * | 10/1980 | Mogi | H03J 9/04 348/734 |
| 5,377,274 A | * | 12/1994 | Meyer | H04R 3/04 381/59 |
| 6,181,922 B1 | * | 1/2001 | Iwai | H03H 11/245 326/112 |
| 7,430,412 B1 | | 9/2008 | Steen | |
| 7,546,137 B2 | * | 6/2009 | D'Hont | G06K 7/0008 370/282 |
| 7,639,100 B2 | | 12/2009 | Fuentes | |
| 8,131,387 B2 | * | 3/2012 | Zhang | G01R 31/31907 700/108 |
| 8,571,507 B2 | | 10/2013 | Barak | |
| 2004/0203982 A1 | * | 10/2004 | Barak | H03G 3/3036 455/522 |
| 2007/0047969 A1 | * | 3/2007 | Nakashima | G02F 1/2255 398/198 |
| 2008/0107328 A1 | * | 5/2008 | Chen | G06T 7/0004 382/149 |
| 2008/0232817 A1 | * | 9/2008 | Futami | B82Y 20/00 398/160 |
| 2010/0319046 A1 | * | 12/2010 | Albag | H04L 5/06 725/131 |
| 2013/0043962 A1 | | 2/2013 | Granger-Jones | |

FOREIGN PATENT DOCUMENTS

| | | |
|---|---|---|
| CN | 201352781 Y | 11/2009 |
| CN | 103367848 A | 10/2013 |

* cited by examiner

*Primary Examiner* — Hassan Phillips
*Assistant Examiner* — Prenell Jones
(74) *Attorney, Agent, or Firm* — Meyertons Hood Kivlin Kowert & Goetzel, P.C.; Jeffrey C. Hood; Brian E. Moore (57) ABSTRACT

Systems and methods for partitioning the frequency spectrum for use in a plurality of function circuits, including step attenuation, phase modulation, and gain amplification functional circuits. A system may include a programmable step attenuator including selection circuitry and functional circuitry. First selection circuitry may include a plurality of outputs and may receive a signal and selectively provide the signal to an output based on the signal's frequency. First circuitry may be coupled to one of the outputs and may operate as a first step attenuator for signals in a first portion of the frequency spectrum. Second circuitry may be coupled to another output and operate as a second step attenuator for signals in a second portion of the frequency spectrum. Second selection circuitry may be coupled to the first and second circuitry and may provide a step attenuated signal from the first or second portion of the frequency spectrum.

26 Claims, 8 Drawing Sheets

ULTRA-BROADBAND PROGRAMMABLE HYBRID STEP ATTENUATOR

FIELD OF THE INVENTION

The present invention relates to the field of programmable step attenuators, and more particularly to a programmable hybrid step attenuator useable to step attenuate signals over a broad range of the frequency spectrum.

DESCRIPTION OF THE RELATED ART

There are two basic types of step attenuators, mechanical and electronic. Typical mechanical step attenuators are generally characterized as slow, expensive, and bulky. Additionally, mechanical step attenuators generally have a limited life of 1 to 5 million cycles. Electronic, pin diode switch based step attenuators are typically less expensive and faster than mechanical step attenuators and are generally useable for on the higher end of the frequency spectrum, e.g., microwave and radio frequency (RF) frequency ranges. However, pin based step attenuators have a limited frequency range on the lower end of the frequency spectrum.

Alternatively, RF micro-electro-mechanical system (MEMS) switches may be used to build a step attenuator. RF MEMS switches are micro-mechanical switches, thus, step attenuators built using RF MEMS switches are generally useable for the lower end of the frequency spectrum, typically working from zero frequency (direct current (DC)) to RF frequencies. However, RF MEMS switches are not as effective at microwave frequencies because of a lack of isolation between switch-ports at microwave frequencies. Additionally, RF MEMS switches are electro-static discharge (ESD) sensitive.

SUMMARY OF THE INVENTION

Various embodiments of a system and method for step attenuating signals over a broad range of the frequency spectrum are presented below. In one embodiment, a broadband selection circuit may include first and second selection circuitry. The first selection circuitry may be configured to receive a signal at an input, selectively provide the signal to one of a plurality of outputs based on the frequency of the signal. Each output of the plurality of outputs may be associated with a portion of the frequency spectrum.

Additionally, the first circuitry may be coupled to a plurality of functional circuits. Accordingly, each functional circuit of the plurality of functional circuits may be coupled to a corresponding output of the plurality of outputs of the first circuitry. Further, each functional circuit may be configured to perform a function for the signal if the signal is in the portion of the frequency spectrum associated with the respective output of the plurality of outputs.

In one embodiment, the plurality of functional circuits may include a plurality of programmable step attenuators. Accordingly, each of the plurality of programmable step attenuators may perform the function for the signal. In such embodiments, the function may include step attenuation of the signal. In another embodiment, the plurality of functional circuits may include a plurality of phase modulators and each of the plurality of phase modulators may perform the function for the signal. In such embodiments the function may include phase modulation of the signal. In yet another embodiment the plurality of functional circuits may include a plurality of gain amplifiers. Accordingly, each of the plurality of gain amplifiers may perform the function for the signal and the function may include gain amplification of the signal Further, the second selection circuitry may be coupled to the plurality of functional circuits. Accordingly, the second selection circuitry may be configured to provide the signal to an output of the second selection circuitry.

In an exemplary embodiment, a programmable step attenuator may include first and second selection circuitry and first and second circuitry. The first selection circuitry may be configured to receive a signal at an input, selectively provide the signal to a first output if the signal is in a first portion of the frequency spectrum and selectively provide the signal to a second output if the signal is in a second portion of the frequency spectrum.

Additionally, the first circuitry may be coupled to the first output of the first selection circuitry. In certain embodiments, the first circuitry may operate as a first step attenuator for the signal if the signal is in the first portion of the frequency spectrum. In an exemplary embodiment, the first circuitry may include a plurality of pin-diode switches and the plurality of pin-diode switches may operate as the first step attenuator for the signal if the signal is in the first portion of the frequency spectrum. Each pin-diode switch may be associated with a respective fixed attenuator.

Similarly, second circuitry may be coupled to the second output of the first selection circuitry. Accordingly, in some embodiments, the second circuitry may operate as a second step attenuator for the signal if the signal is in the second portion of the frequency spectrum. In an exemplary embodiment, the second circuitry may include a plurality of radio frequency (RF) micro-electro-mechanical system (MEMS) switches and the plurality of RF MEMS switches may operate as the second step attenuator for the signal if the signal is in the second portion of the frequency spectrum. Each RF MEMS switch may be associated with a respective fixed attenuator. Additionally, in certain embodiments, the second circuitry may also include a relay and the relay may be configured to protect the plurality of RF MEMS switches. In other embodiments, the second circuitry may also include an electrostatic discharge (ESD) protection device and the ESD protection device may be configured to protect both the first and second circuitry, including the plurality of RF MEMS switches. Note that in some embodiments, the second circuitry may also include both a relay and an ESD protection device and each may be configured to protect the plurality of RF MEMS switches.

Further, second selection circuitry may be coupled to the first circuitry and the second circuitry. Thus, the second selection circuitry may be configured to provide either a step attenuated signal from the first portion of the frequency spectrum or a step attenuated signal from the second portion of the frequency spectrum.

In an exemplary embodiment, a programmable hybrid step attenuator may include a first diplexer, a plurality of pin-diode switches, a plurality of RF MEMS switches, and a second diplexer. Each pin-diode switch may be associated with a respective fixed attenuator. The first diplexer may include an input, a first output, and a second output. Further, the first diplexer may be configured to receive a signal at the input, selectively provide the signal to the first output if the signal is in a first portion of the frequency spectrum, and selectively provide the signal to the second output if the signal is in a second portion of the frequency spectrum.

In one embodiment, the plurality of pin-diode switches may be coupled to the first output of the first diplexer and the plurality of pin-diode switches may operate as a first step attenuator for the signal if the signal is in the first portion of the frequency spectrum.

Accordingly, the plurality of RF MEMS switches may be coupled to the second output of the first diplexer and the plurality of RF MEMS switches may operate as a second step attenuator for the signal if the signal is in the second portion of the frequency spectrum. Each RF MEMS switch may be associated with a respective fixed attenuator. In certain embodiments, a relay may be coupled between the second output of the first diplexer and the plurality of RF MEMS switches and the relay may be configured to protect the plurality of RF MEMS switches from switching when current is flowing through the switch, e.g., hot switching. In other embodiments, an ESD protection device coupled between the second output of the first diplexer and the plurality of RF MEMS switches and the ESD protection device may be configured to protect the plurality of RF MEMS switches.

The second diplexer may include a first input, a second input, and an output. In certain embodiments, the first input may be coupled to the first step attenuator and the second input may be coupled to the second step attenuator. Thus, the second diplexer may be configured to output a step attenuated signal from either the first or second portion of the frequency spectrum.

In some embodiments, the plurality of pin-diode switches may operate as the first step attenuator for the signal if the signal is in a high portion of the frequency spectrum and the plurality of RF MEMS switches may operate as the second step attenuator for the signal if the signal is in a low portion of the frequency spectrum. In one embodiment, the first portion of the frequency spectrum may include frequencies above 60 Megahertz and the second portion may include frequencies below 60 Megahertz. Note that in various embodiments the first and second step attenuators may be programmable to provide a first level of attenuation.

In another exemplary embodiment, a test instrument may include a functional unit, a signal receiver, and a programmable step attenuator. The functional unit may be coupled to the signal receiver and the programmable step attenuator. Additionally, the signal receiver may be coupled to the programmable step attenuator. In one embodiment, the programmable step attenuator may include first and second selection circuitry and first and second circuitry. The first selection circuitry may be configured to receive a signal at an input, selectively provide the signal to a first output if the signal is in a first portion of the frequency spectrum and selectively provide the signal to a second output if the signal is in a second portion of the frequency spectrum.

Additionally, the first circuitry may be coupled to the first output of the first selection circuitry. In certain embodiments, the first circuitry may operate as a first step attenuator for the signal if the signal is in the first portion of the frequency spectrum. In an exemplary embodiment, the first circuitry may include a plurality of pin-diode switches and the plurality of pin-diode switches may operate as the first step attenuator for the signal if the signal is in the first portion of the frequency spectrum. Each pin-diode switch may be associated with a respective fixed attenuator.

Similarly, second circuitry may be coupled to the second output of the first selection circuitry. Accordingly, in some embodiments, the second circuitry may operate as a second step attenuator for the signal if the signal is in the second portion of the frequency spectrum. In an exemplary embodiment, the second circuitry may include a plurality of RF MEMS switches and the plurality of RF MEMS switches may operate as the second step attenuator for the signal if the signal is in the second portion of the frequency spectrum. Each RF MEMS switch may be associated with a respective fixed attenuator. Additionally, in certain embodiments, the second circuitry may also include a relay and the relay may be configured to protect the plurality of RF MEMS switches from hot switching. In other embodiments, the second circuitry may also include an ESD protection device and the ESD protection device may be configured to protect the plurality of RF MEMS switches. Note that in some embodiments, the second circuitry may also include both a relay and an ESD protection device and each may be configured to protect the plurality of RF MEMS switches.

Further, second selection circuitry may be coupled to the first circuitry and the second circuitry. Thus, the second selection circuitry may be configured to provide either a step attenuated signal from the first portion of the frequency spectrum or a step attenuated signal from the second portion of the frequency spectrum.

Accordingly, in certain embodiments, the functional unit may be configured to analyze the stepped attenuated signal or transmit the stepped attenuated signal to another functional unit or computer system for analysis.

In another embodiment, a method for attenuating a signal may include receiving a signal at an input. The signal may be selectively provided to a first output if the signal is in a first portion of the frequency spectrum, or to a second output if the signal is in a second portion of the frequency spectrum. First step attenuation of the signal may be performed if the signal is in the first portion of the frequency spectrum and may include receiving the signal from the first output. Additionally, second step attenuation of the signal may be performed if the signal is in the second portion of the frequency spectrum and may include receiving the signal from the second output. Further, either a first step attenuated signal or a second step attenuated signal may be provided as an output.

In certain embodiments, selectively providing the signal may include a diplexer selectively providing the signal to the first output if the signal is in the first portion of the frequency spectrum. Additionally, the diplexer may selectively provide the signal to the second output if the signal is in the second portion of the frequency spectrum.

Further, in some embodiments, the first step attenuation may be performed using a plurality of pin-diode switches and the second step attenuation may be performed using a plurality of RF MEMS switches. Additionally, in certain embodiments, the plurality of RF MEMS switches may be protected by a relay, an ESD protection device, or both.

In some embodiments of the method, a diplexer may receive the first step attenuated signal at a first input of the diplexer or the second step attenuated signal at a second input of the diplexer and then may provide either the first step attenuated signal or the second step attenuated signal at an output of the diplexer.

Additionally, in some embodiments, the first step attenuation may be performed to attenuate the signal if the signal is in a high portion of the frequency spectrum and the second step attenuation may be performed to attenuate the signal if the signal is in a low portion of the frequency spectrum.

BRIEF DESCRIPTION OF THE DRAWINGS

A better understanding of the present invention can be obtained when the following detailed description of the preferred embodiment is considered in conjunction with the following drawings, in which.

While the invention is susceptible to various modifications and alternative forms, specific embodiments thereof are shown by way of example in the drawings and are herein described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE INVENTION

Terms

The following is a glossary of terms used in the present application:

Memory Medium—Any of various types of non-transitory computer accessible memory devices or storage devices. The term "memory medium" is intended to include an installation medium, e.g., a CD-ROM, floppy disks 104, or tape device; a computer system memory or random access memory such as DRAM, DDR RAM, SRAM, EDO RAM, Rambus RAM, etc.; a non-volatile memory such as a Flash, magnetic media, e.g., a hard drive, or optical storage; registers, or other similar types of memory elements, etc. The memory medium may comprise other types of non-transitory memory as well or combinations thereof. In addition, the memory medium may be located in a first computer in which the programs are executed, or may be located in a second different computer which connects to the first computer over a network, such as the Internet. In the latter instance, the second computer may provide program instructions to the first computer for execution. The term "memory medium" may include two or more memory mediums which may reside in different locations, e.g., in different computers that are connected over a network.

Carrier Medium—a memory medium as described above, as well as a physical transmission medium, such as a bus, network, and/or other physical transmission medium that conveys signals such as electrical, electromagnetic, or digital signals.

Software Program—the term "software program" is intended to have the full breadth of its ordinary meaning, and includes any type of program instructions, code, script and/or data, or combinations thereof, that may be stored in a memory medium and executed by a processor. Exemplary software programs include programs written in text-based programming languages, such as C, C++, PASCAL, FORTRAN, COBOL, JAVA, assembly language, etc.; graphical programs (programs written in graphical programming languages); assembly language programs; programs that have been compiled to machine language; scripts; and other types of executable software. A software program may comprise two or more software programs that interoperate in some manner. Note that various embodiments described herein may be implemented by a computer or software program. A software program may be stored as program instructions on a memory medium.

Hardware Configuration Program—a program, e.g., a netlist or bit file, that can be used to program or configure a programmable hardware element.

Program—the term "program" is intended to have the full breadth of its ordinary meaning The term "program" includes 1) a software program which may be stored in a memory and is executable by a processor or 2) a hardware configuration program useable for configuring a programmable hardware element.

Graphical Program—A program comprising a plurality of interconnected nodes or icons, wherein the plurality of interconnected nodes or icons visually indicate functionality of the program. The interconnected nodes or icons are graphical source code for the program. Graphical function nodes may also be referred to as blocks.

The following provides examples of various aspects of graphical programs. The following examples and discussion are not intended to limit the above definition of graphical program, but rather provide examples of what the term "graphical program" encompasses:

The nodes in a graphical program may be connected in one or more of a data flow, control flow, and/or execution flow format. The nodes may also be connected in a "signal flow" format, which is a subset of data flow.

Exemplary graphical program development environments which may be used to create graphical programs include LabVIEW®, DasyLab™, DIADem™ and Matrixx/SystemBuild™ from National Instruments, Simulink® from the MathWorks, VEE™ from Agilent, WiT™ from Coreco, Vision Program Manager™ from PPT Vision, SoftWIRE™ from Measurement Computing, Sanscript™ from Northwoods Software, Khoros™ from Khoral Research, SnapMaster™ from HEM Data, VisSim™ from Visual Solutions, ObjectBench™ by SES (Scientific and Engineering Software), and VisiDAQ™ from Advantech, among others.

The term "graphical program" includes models or block diagrams created in graphical modeling environments, wherein the model or block diagram comprises interconnected blocks (i.e., nodes) or icons that visually indicate operation of the model or block diagram; exemplary graphical modeling environments include Simulink®, SystemBuild™, VisSim™, Hypersignal Block Diagram™, etc.

A graphical program may be represented in the memory of the computer system as data structures and/or program instructions. The graphical program, e.g., these data structures and/or program instructions, may be compiled or interpreted to produce machine language that accomplishes the desired method or process as shown in the graphical program.

Input data to a graphical program may be received from any of various sources, such as from a device, unit under test, a process being measured or controlled, another computer program, a database, or from a file. Also, a user may input data to a graphical program or virtual instrument using a graphical user interface, e.g., a front panel.

A graphical program may optionally have a GUI associated with the graphical program. In this case, the plurality of interconnected blocks or nodes are often referred to as the block diagram portion of the graphical program.

Node—In the context of a graphical program, an element that may be included in a graphical program. The graphical program nodes (or simply nodes) in a graphical program may also be referred to as blocks. A node may have an associated icon that represents the node in the graphical program, as well as underlying code and/or data that implements functionality of the node. Exemplary nodes (or blocks) include function nodes, sub-program nodes, terminal nodes, structure nodes, etc. Nodes may be connected together in a graphical program by connection icons or wires.

Data Flow Program—A Software Program in which the program architecture is that of a directed graph specifying the flow of data through the program, and thus functions execute whenever the necessary input data are available. Data flow programs can be contrasted with procedural programs, which specify an execution flow of computations to be performed. As used herein "data flow" or "data flow programs" refer to "dynamically-scheduled data flow" and/or "statically-defined data flow".

Graphical Data Flow Program (or Graphical Data Flow Diagram)—A Graphical Program which is also a Data Flow Program. A Graphical Data Flow Program comprises a plurality of interconnected nodes (blocks), wherein at least a subset of the connections among the nodes visually indicate that data produced by one node is used by another node. A LabVIEW VI is one example of a graphical data flow program. A Simulink block diagram is another example of a graphical data flow program.

Graphical User Interface—this term is intended to have the full breadth of its ordinary meaning The term "Graphical User Interface" is often abbreviated to "GUI". A GUI may comprise only one or more input GUI elements, only one or more output GUI elements, or both input and output GUI elements.

The following provides examples of various aspects of GUIs. The following examples and discussion are not intended to limit the ordinary meaning of GUI, but rather provide examples of what the term "graphical user interface" encompasses:

A GUI may comprise a single window having one or more GUI Elements, or may comprise a plurality of individual GUI Elements (or individual windows each having one or more GUI Elements), wherein the individual GUI Elements or windows may optionally be tiled together.

A GUI may be associated with a graphical program. In this instance, various mechanisms may be used to connect GUI Elements in the GUI with nodes in the graphical program. For example, when Input Controls and Output Indicators are created in the GUI, corresponding nodes (e.g., terminals) may be automatically created in the graphical program or block diagram. Alternatively, the user can place terminal nodes in the block diagram which may cause the display of corresponding GUI Elements front panel objects in the GUI, either at edit time or later at run time. As another example, the GUI may comprise GUI Elements embedded in the block diagram portion of the graphical program.

Front Panel—A Graphical User Interface that includes input controls and output indicators, and which enables a user to interactively control or manipulate the input being provided to a program, and view output of the program, while the program is executing.

A front panel is a type of GUI. A front panel may be associated with a graphical program as described above.

In an instrumentation application, the front panel can be analogized to the front panel of an instrument. In an industrial automation application the front panel can be analogized to the MMI (Man Machine Interface) of a device. The user may adjust the controls on the front panel to affect the input and view the output on the respective indicators.

Graphical User Interface Element—an element of a graphical user interface, such as for providing input or displaying output. Exemplary graphical user interface elements comprise input controls and output indicators.

Input Control—a graphical user interface element for providing user input to a program. An input control displays the value input by the user and is capable of being manipulated at the discretion of the user. Exemplary input controls comprise dials, knobs, sliders, input text boxes, etc.

Output Indicator—a graphical user interface element for displaying output from a program. Exemplary output indicators include charts, graphs, gauges, output text boxes, numeric displays, etc. An output indicator is sometimes referred to as an "output control".

Programmable Hardware Element—includes various hardware devices comprising multiple programmable function blocks connected via a programmable interconnect. Examples include FPGAs (Field Programmable Gate Arrays), PLDs (Programmable Logic Devices), FPOAs (Field Programmable Object Arrays), and CPLDs (Complex PLDs). The programmable function blocks may range from fine grained (combinatorial logic or look up tables) to coarse grained (arithmetic logic units or processor cores). A programmable hardware element may also be referred to as "reconfigurable logic".

Computer System—any of various types of computing or processing systems, including a personal computer system (PC), mainframe computer system, workstation, network appliance, Internet appliance, personal digital assistant (PDA), television system, grid computing system, or other device or combinations of devices. In general, the term "computer system" can be broadly defined to encompass any device (or combination of devices) having at least one processor that executes instructions from a memory medium.

Measurement Device—includes instruments, data acquisition devices, smart sensors, and any of various types of devices that are configured to acquire and/or store data. A measurement device may also optionally be further configured to analyze or process the acquired or stored data. Examples of a measurement device include an instrument, such as a traditional stand-alone "box" instrument, a computer-based instrument (instrument on a card) or external instrument, a data acquisition card, a device external to a computer that operates similarly to a data acquisition card, a smart sensor, one or more DAQ or measurement cards or modules in a chassis, an image acquisition device, such as an image acquisition (or machine vision) card (also called a video capture board) or smart camera, a motion control device, a robot having machine vision, and other similar types of devices. Exemplary "stand-alone" instruments include oscilloscopes, multimeters, signal analyzers, arbitrary waveform generators, spectroscopes, and similar measurement, test, or automation instruments.

A measurement device may be further configured to perform control functions, e.g., in response to analysis of the acquired or stored data. For example, the measurement device may send a control signal to an external system, such as a motion control system or to a sensor, in response to particular data. A measurement device may also be configured to perform automation functions, i.e., may receive and analyze data, and issue automation control signals in response.

Functional Unit (or Processing Element)—refers to various elements or combinations of elements. Processing elements include, for example, circuits such as an ASIC (Application Specific Integrated Circuit), portions or circuits of individual processor cores, entire processor cores, individual processors, programmable hardware devices such as a field programmable gate array (FPGA), and/or larger portions of systems that include multiple processors, as well as any combinations thereof.

Automatically—refers to an action or operation performed by a computer system (e.g., software executed by the computer system) or device (e.g., circuitry, programmable hardware elements, ASICs, etc.), without user input directly specifying or performing the action or operation. Thus the term "automatically" is in contrast to an operation being manually performed or specified by the user, where the user provides input to directly perform the operation. An automatic procedure may be initiated by input provided by the user, but the subsequent actions that are performed "automatically" are not specified by the user, i.e., are not performed "manually", where the user specifies each action to perform. For example, a user filling out an electronic form by selecting each field and providing input specifying information (e.g., by typing information, selecting check boxes, radio selections, etc.) is filling out the form manually, even though the computer system must update the form in response to the user actions. The form may be automatically filled out by the computer system where the computer system (e.g., software executing on the computer system) analyzes the fields of the form and fills in the form without any user input specifying the answers to the fields. As indicated above, the user may invoke the automatic filling of the form, but is not involved in the actual filling of the form (e.g., the user is not manually specifying answers to fields but rather they are being automatically completed). The present specification provides various examples of operations being automatically performed in response to actions the user has taken.

Concurrent—refers to parallel execution or performance, where tasks, processes, or programs are performed in an at least partially overlapping manner. For example, concurrency may be implemented using "strong" or strict parallelism, where tasks are performed (at least partially) in parallel on respective computational elements, or using "weak parallelism", where the tasks are performed in an interleaved manner, e.g., by time multiplexing of execution threads.

Approximately—refers to a value that is almost correct or exact. For example, approximately may refer to a value that is within 1 to 10 percent of the exact (or desired) value. Thus, an attenuator may have an attenuation level of approximately 10 dB. In such an instance, the actual value of the attenuation level may be in the range of 9.0 to 9.9 dB and would be considered approximately 10 dB. It should be noted, however, that the actual threshold value (or tolerance) may be application dependent. For example, in one embodiment, "approximately" may mean within 0.1% of some specified or desired value, while in various other embodiments, the threshold may be, for example, 2%, 3%, 5%, and so forth, as desired or as required by the particular application.

Figure 1A:
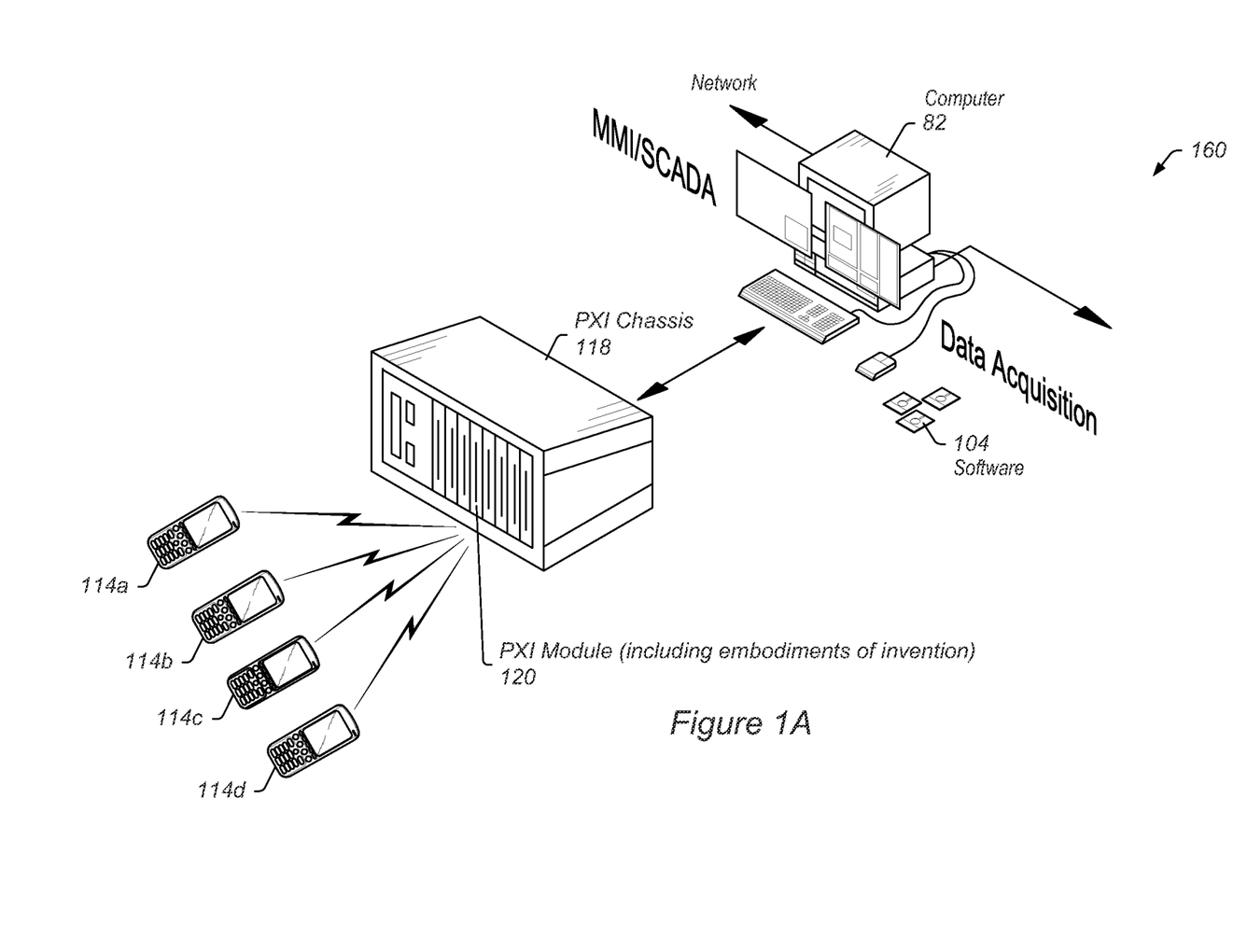
FIG. 1A illustrates a system configured to step attenuate signals from devices under test (DUTs) according to an embodiment of the present invention.
Figure 1B:
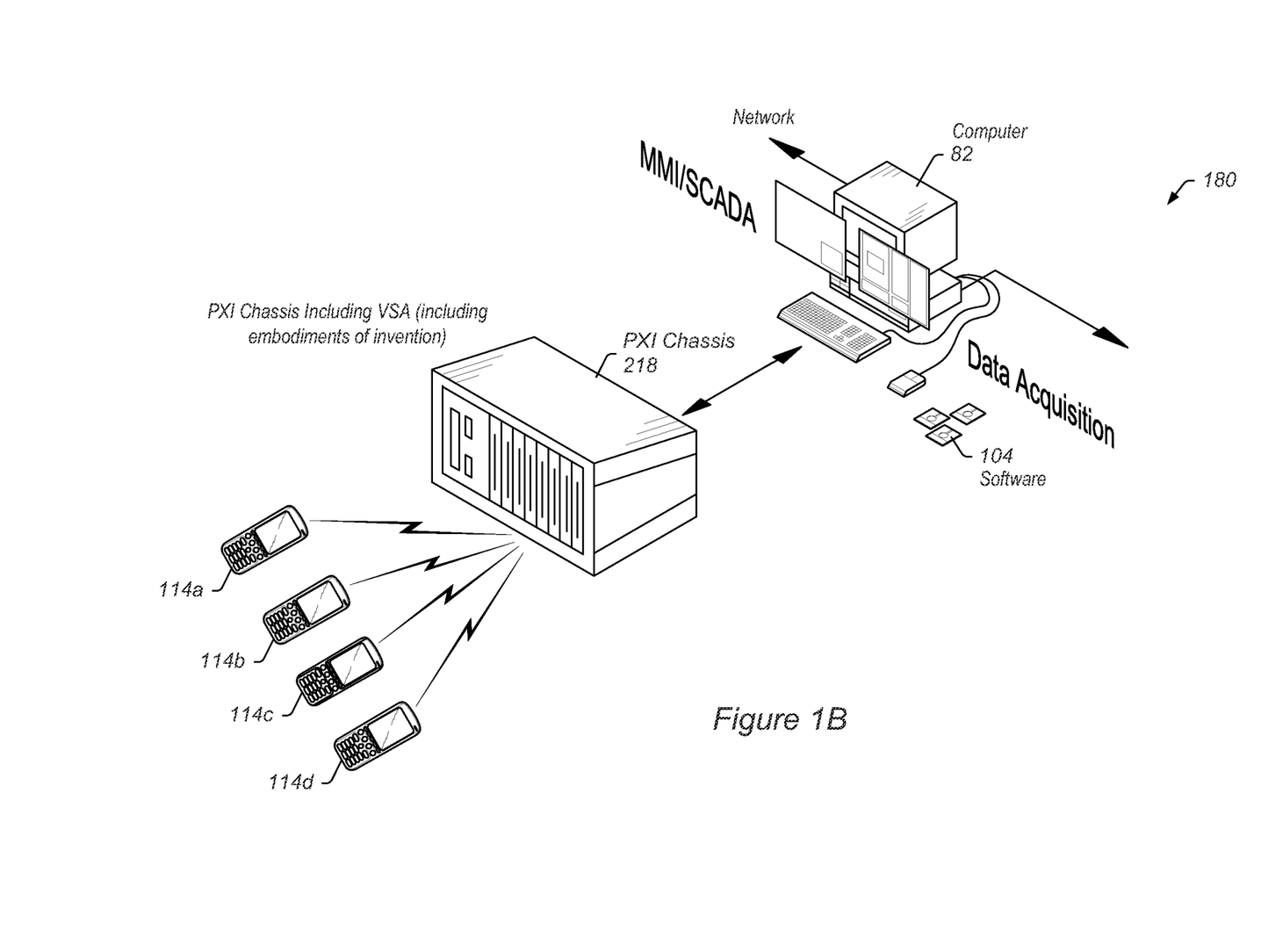
FIG. 1B illustrates a system configured to step attenuate signals DUTs according to another embodiment of the present invention.

FIGS. 1A and 1B—Test Systems

FIGS. 1A and 1B illustrate radio frequency (RF) test systems 160 and 180. One or more programmable hybrid step attenuators according to embodiments of the present invention may be included in PXI module 120 of PXI chassis 118. Similarly, the vector signal analyzer (VSA) included in PXI chassis 218 may include one or more programmable hybrid step attenuators according to embodiments of the present invention. Thus, both PXI chassis 118 and PXI chassis 218 may be configured to step attenuate signals received from one or more devices under test (DUTs), such as DUTs 114a-114d using a programmable hybrid step attenuator as described herein. As shown in FIGS. 1A and 1B, the computer 82 may include a display device and at least one memory medium on which one or more computer programs or software components, such as software 104, may be stored. The one or more computer programs or software components may be configured to analyze data collected by PXI chassis 118 via PXI module 120 or by PXI chassis 218 via the VSA. For example, PXI module 120 may be configured to receive signals generated by DUTs 114a-114d and step attenuate the received signals according to embodiments of the present invention. Similarly, the VSA included in PXI chassis 218 may be configured to receive signals generated by DUTs 114a-114d and step attenuate the received signals according to embodiments of the present invention. In addition, PXI module 120 and the VSA included in PXI chassis 218 may be configured to perform embodiments of the methods described herein.

As shown in FIG. 1A, the computer system 82 may include a display device configured to display a graphical program as the graphical program is created and/or executed. The display device may also be configured to display a graphical user interface or front panel of the graphical program during execution of the graphical program. The graphical user interface may comprise any type of graphical user interface, e.g., depending on the computing platform.

The computer system 82 may include at least one memory medium on which one or more computer programs or software components according to one embodiment of the present invention may be stored. For example, the memory medium may store one or more graphical programs which are executable to perform the methods described herein. Additionally, the memory medium may store a graphical programming development environment application used to create and/or execute such graphical programs. The memory medium may also store operating system software, as well as other software for operation of the computer system. Various embodiments further include receiving or storing instructions and/or data implemented in accordance with the foregoing description upon a carrier medium.

Figure 2:
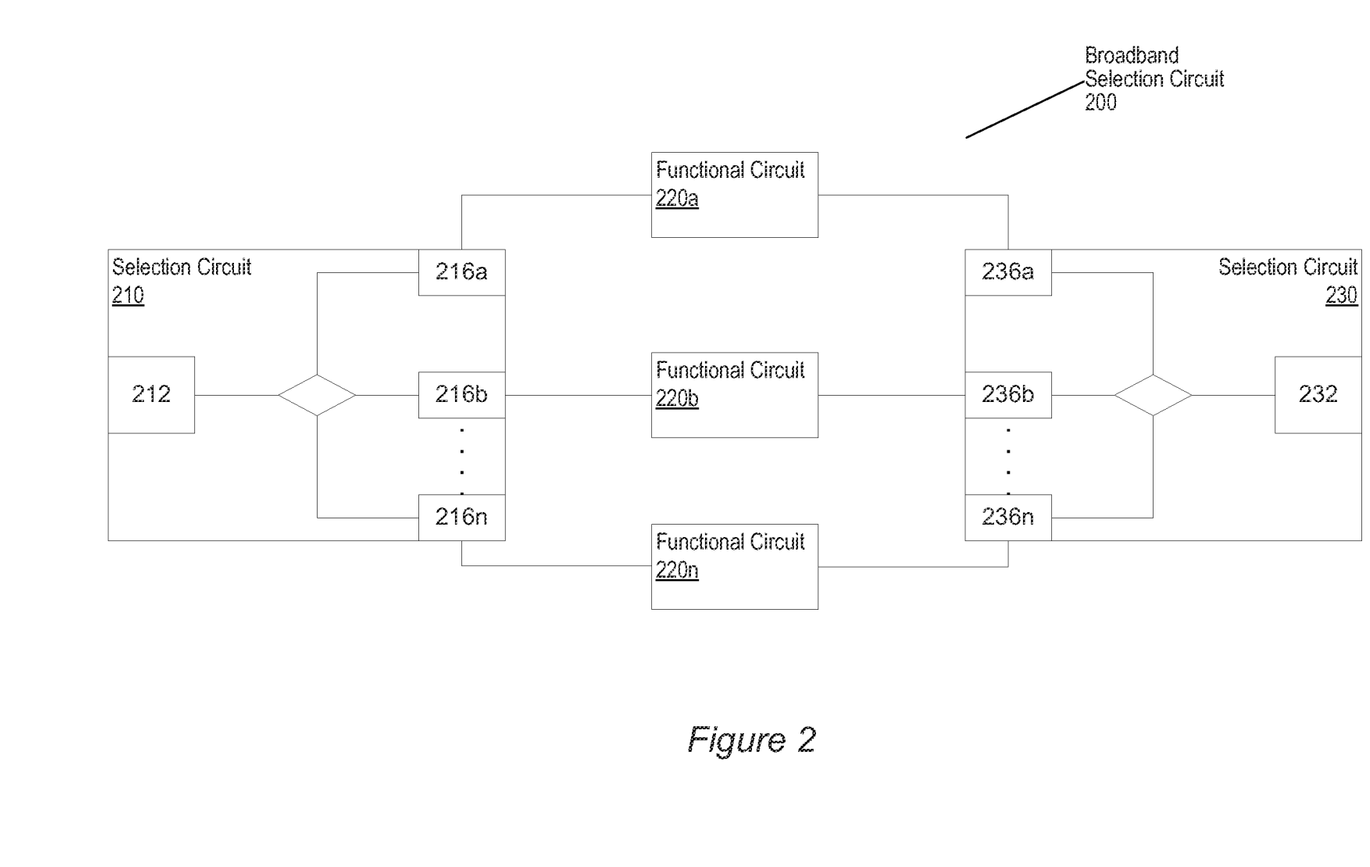
FIG. 2 is a high level block diagram of a broadband selection circuit according to one embodiment of the present invention.

FIG. 2—High Level Block Diagram of a Broadband Selection Circuit

FIG. 2 illustrates a high level block diagram of a broadband selection circuit according to one embodiment of the present invention. A broadband selection circuit such as broadband selection circuit 200 may include selection circuits 210 and 240 and functional circuits 220a-220n. Thus, broadband selection circuit 200 may include first and second selection circuitry and a plurality of functional circuits.

Selection circuit 210 (the first selection circuitry) may be configured to receive a signal at input 212. The signal may be of any frequency within the frequency spectrum; in other words, from DC, or zero-frequency, on the low end, to radio frequencies, or 3 kilohertz (kHz) to 300 gigahertz (GHz), on the high end. In one embodiment, selection circuit 210 may selectively provide the signal to an output 216a-n based on the frequency of the signal. In other words, the selection circuit 210 may be configured to partition the frequency spectrum into a plurality of portions and provide the signal to an output corresponding to a portion of the frequency spectrum. Thus, selection circuit 210 may be configured to selectively provide the signal to one of a plurality of outputs 220*a-n* based on the frequency of the signal.

Each functional circuit 220*a-n* may each be configured to perform a function for the signal. Accordingly, in one embodiment, functional circuits 220*a-n* may be configured as programmable step attenuators. In such embodiments, the function may include step attenuation of the signal. In another embodiment, the plurality of functional circuits 220*a-n* may be configured as phase modulators and the function may include phase modulation of the signal. In yet another embodiment, functional circuits 220*a-n* may be configured as gain amplifiers. Accordingly, the function may include gain amplification of the signal.

Additionally, selection circuit 230 (second selection circuitry) may be coupled to functional circuits 220*a-n* via inputs 236*a-n*, each input corresponding to a functional circuit. Further, selection circuit 230 may be configured to provide the signal to an output 232.

Figure 3:
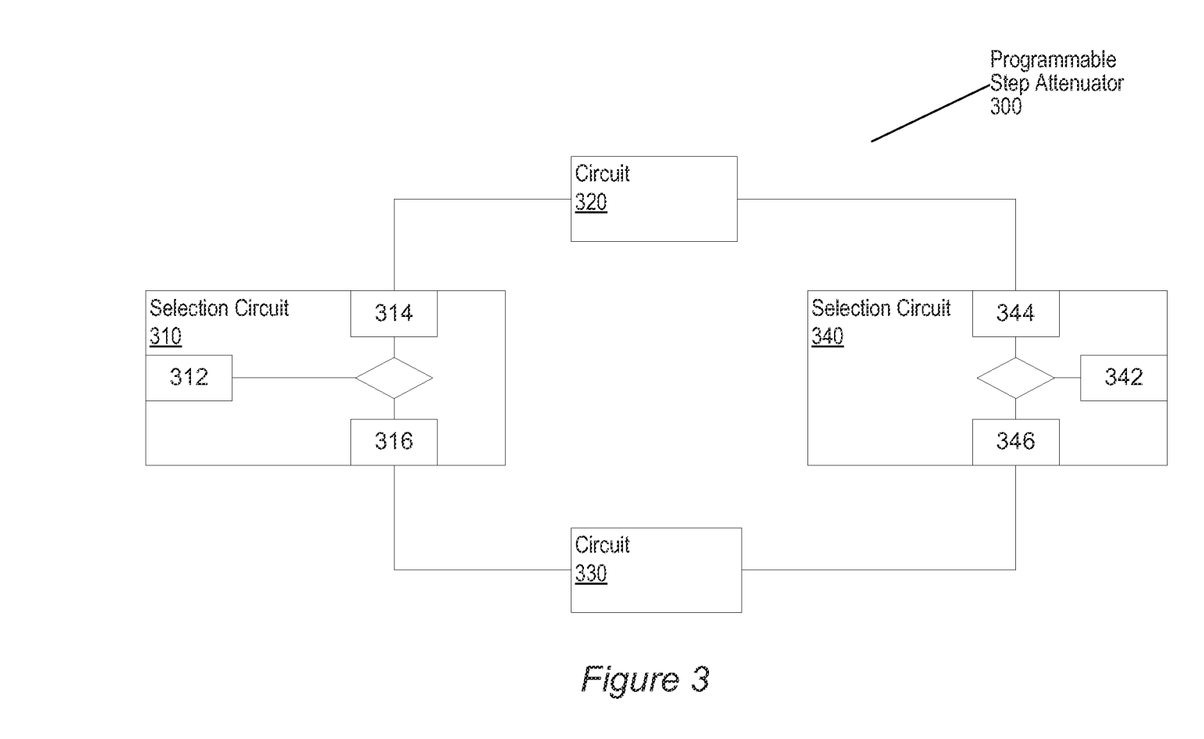
FIG. 3 is a high level block diagram of an exemplary programmable step attenuator according to one embodiment of the present invention.

FIG. 3—High Level Block Diagram of a Programmable Hybrid Step Attenuator

FIG. 3 illustrates a high level block diagram of a programmable hybrid step attenuator according to one embodiment of the present invention. A programmable hybrid step attenuator such as programmable step attenuator 300 may include selection circuits 310 and 340 and circuits 320 and 330. Thus, programmable step attenuator 300 may include first and second selection circuitry and first and second circuitry.

Selection circuit 310 (the first selection circuitry) may be configured to receive a signal at input 312. The signal may be of any frequency within the frequency spectrum; in other words, from DC, or zero-frequency, on the low end, to radio frequencies, or 3 kilohertz (kHz) to 300 gigahertz (GHz), on the high end. In one embodiment, selection circuit 310 may selectively provide the signal to an output based on the frequency of the signal. In other words, the selection circuit 310 may be configured to partition the frequency spectrum into two or more portions and provide the signal to an output corresponding to a portion of the frequency spectrum. Thus, selection circuit 310 may be configured to selectively provide the signal to a first output, such as output 314, if the signal is in a first portion of the frequency spectrum. Similarly, selection circuit 310 may be configured to selectively provide the signal to a second output, such as output 316, if the signal is in a second portion of the frequency spectrum.

In other words, in some embodiments, the frequency spectrum may have a first, or high portion, and a second, or low portion. Additionally, in certain embodiments, selection circuit 310 may be configured to provide the signal to multiple outputs if the frequency of the signal corresponds to a crossover frequency of the selection circuitry. It is envisioned that the crossover frequency may be any frequency within the frequency spectrum. Thus, for example, if the first portion of the frequency spectrum included frequencies above 60 Megahertz (MHz) and the second portion included frequencies below 60 MHz, then 60 MHz may correspond to the crossover frequency of the selection circuit and selection circuit 310 may be configured to provide the 60 MHz signal to both the output corresponding to the first portion of the frequency spectrum and to the output corresponding to the second portion of the frequency spectrum.

In one embodiment, circuit 320 (the first circuitry) may be coupled to output 314 of selection circuit 310. Thus, circuit 320 may receive the signal if the signal is in the first portion of the frequency spectrum. In other words, signals with a frequency within the first portion of the frequency spectrum may be routed to circuit 320. For example, in one embodiment, if the first portion includes frequencies above 60 MHz, then signals with a frequency above 60 MHz may be routed to circuit 320. Further, circuit 320 may operate as a step attenuator for the signal and may be configured to provide a step attenuated signal from the first portion of the frequency spectrum.

Similarly, circuit 330 (the second circuitry) may be coupled to output 316 of selection circuit 310. Thus, in certain embodiments, circuit 330 may receive the signal if the signal is in the second portion of the frequency spectrum. In other words, signals with a frequency within the second portion of the frequency spectrum may be routed to circuit 330. For example, in one embodiment, if the second portion includes frequencies below 60 MHz, then signals with a frequency below 60 MHz may be routed to circuit 330. Further, circuit 330 may operate as a step attenuator for the signal and may be configured to provide a step attenuated signal from the second portion of the frequency spectrum.

Additionally, selection circuit 340 (the second selection circuitry) may be coupled to circuit 320 via input 344 and circuit 330 via input 346. Selection circuit 340 may be configured to provide at output 342 either a step attenuated signal from the first portion of the frequency spectrum or a step attenuated signal from the second portion of the frequency spectrum. Note that in some embodiments when the frequency of the signal corresponds to the crossover frequency of the first selection circuitry, selection circuit 340 may be further configured to provide at output 342 a step attenuated signal stitched together from a step attenuated signal in the first portion of the frequency spectrum and a step attenuated signal in the second portion of the frequency spectrum.

Note that in certain embodiments, one or both of selection circuits 310 and 340 may include a group delay from a high pass section and from a low pass section for signals at or near the crossover frequency of the selection circuit. The group delay from the high pass section, or portion, may be for signals above the crossover frequency. The group delay from the low pass section, or portion, may be for signals below the crossover frequency. In certain embodiments, the group delay from the high pass and low pass sections, or portions, may be smooth or slowly-varying, i.e., constant or approximately constant, at or near the crossover frequency. Additionally, in certain embodiments, the group delay from high pass and low pass sections, or portions, may be approximately equivalent in value. Note further that the term group delay refers to a measure of time distortion, and in particular, may be a measure of the slope, or gradient, of the phase response of a signal at any given frequency.

In certain embodiments, as described in more detail below in reference to FIG. 3, selection circuits 310 and 330 may each include a diplexer where the diplexer is configured to selectively provide the signal to a first output if the signal is in the first portion of the frequency spectrum and a second output if the signal is in the second portion of the frequency spectrum. Additionally, in an exemplary embodiment, circuit 330 may include a pin-diode based step attenuator which may be configured to attenuate the signal if the signal is in the first portion of the frequency spectrum. Further, circuit 340 may include an RF MEMS based step attenuator which may be configured to attenuate the signal if the signal in in the second portion of the frequency spectrum. In some embodiments, the second circuitry, e.g., circuit 330 may also include protection for the RF MEMS based step attenuator such as a relay, an ESD protection device, or both.

Figure 4:
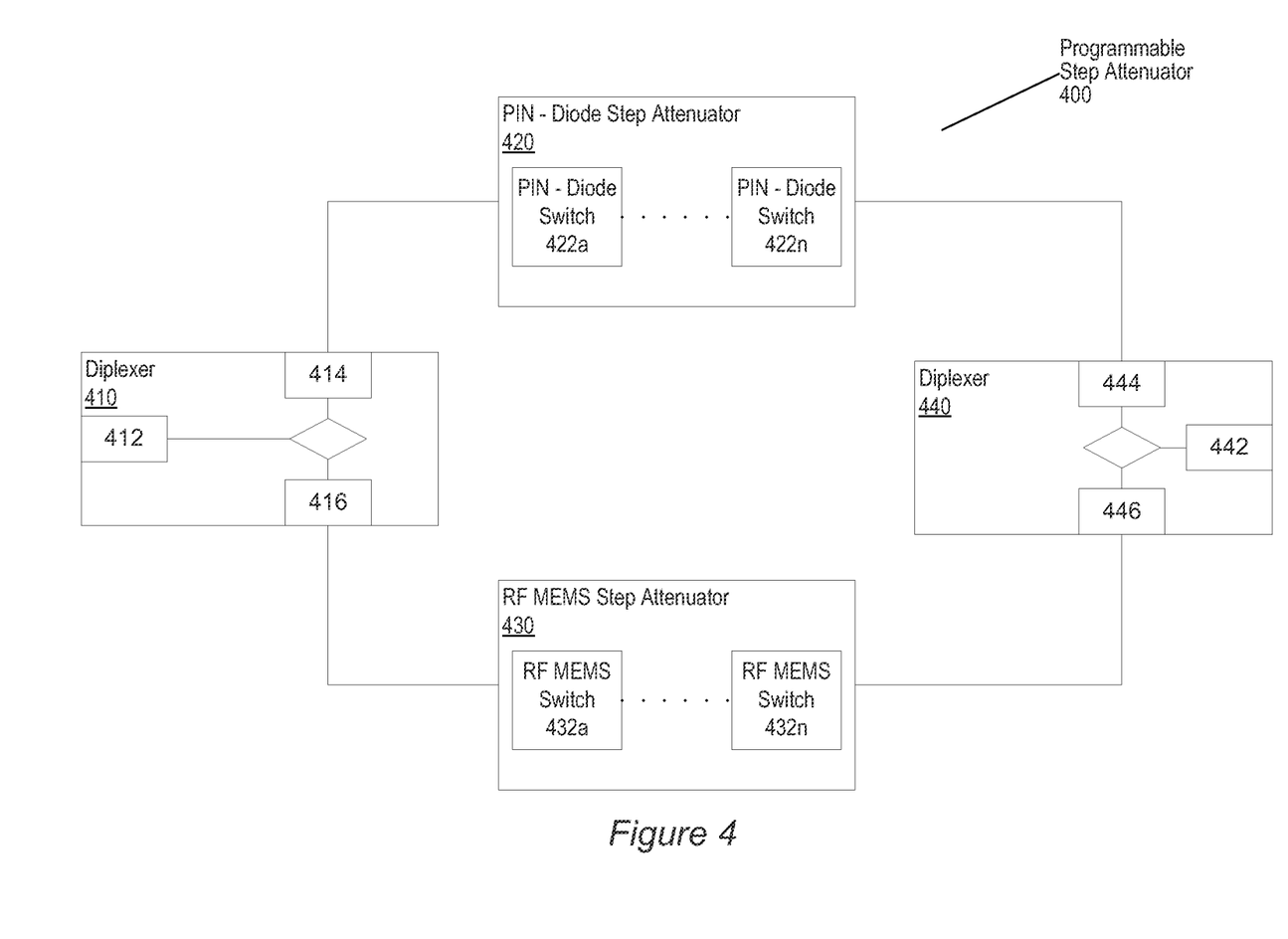
FIG. 4 is a block diagram of an exemplary programmable step attenuator according to another embodiment of the present invention.

FIG. 4—Block Diagram of a Programmable Step Attenuator

FIG. 4 is a block diagram of a programmable step attenuator representing embodiments of the present invention. Elements of the embodiment described herein may be used in combination with any of the previously described features of the present invention and any of the features disclosed below.

Programmable step attenuator 400 may include a diplexer, such as diplexer 410. Diplexer 410 may be configured to receive a signal at input 412 and selectively provide the signal to either output 414 or output 416 based on the frequency of the signal. Thus, the frequency spectrum may be partitioned, or split, into at least two portions, i.e., a first portion and a second portion. The first portion may correspond to a high portion of the frequency spectrum and the second portion may correspond to a low portion of the frequency spectrum. In one embodiment, diplexer 410 may be configured with a crossover frequency of 60 MHz. Accordingly, signals above 60 MHz may correspond to the first, or high, portion of the frequency spectrum and signals below 60 MHz may correspond to the second, or low, portion of the frequency spectrum. Note that it is envisioned that the crossover frequency of diplexer 410 may be configured at other frequencies within the frequency spectrum as well.

In one embodiment, diplexer 410 may be configured to selectively provide the signal to a first output, such as output 414, if the signal is in the first portion of the frequency spectrum. Similarly, diplexer 410 may be configured to selectively provide the signal to a second output, such as output 416, if the signal is in the second portion of the frequency spectrum. Thus, for example, in one embodiment, if the first portion of the frequency spectrum includes frequencies above 60 MHz, then diplexer 410 may be configured to selectively provide signals above 60 MHz to output 414. Accordingly, in such an embodiment, diplexer 410 may be configured to selectively provide signals below 60 MHz to output 416.

In one embodiment, output 414 may be coupled to a plurality of pin-diode switches configured to operate as a first step attenuator for the signal if the signal is in the first portion of the frequency spectrum. Thus, output 414 may be coupled to pin-diode step attenuator 420. Pin-diode step attenuator 420 may include a plurality of pin-diode switches, such as pin-diode switches 432a to 422n. Each pin-diode switch may be associated with a respective fixed attenuator. Accordingly, the plurality of pin-diode switches may operate as the first step attenuator for the signal if the signal is in the high portion of the frequency spectrum. Further, each of the plurality of pin-diode switches may provide a specified level of attenuation. Thus, for example, in one embodiment, a first pin-diode switch of the plurality of pin-diode switches may provide approximately 10 decibels (dB) of attenuation via an associated 10 dB fixed attenuator. Similarly, a second and third pin-diode switch may also each provide approximately 10 dB of attenuation via associated 10 dB fixed attenautors. Further, a fourth pin-diode switch may provide approximately 5 dB of attenuation via an associated 5 dB fixed attenuator. Each pin-diode switch may operate as a single-pole double-throw (SPDT) switch. Therefore, each pin-diode switch has two paths—an on through-line path providing no attenuation and a path through an associated fixed attenuator providing the approximate level of attenuation specified. Thus, in such an embodiment, the plurality of pin-diode switches may be programmable to provide between approximately 5 dB and approximately 35 dB of attenuation in approximately 5 dB increments. In other words, the path of the signal through the sequence of switches may be configured such that a specified, or first, level of attenuation may be achieved. Note, these values are exemplary only, and as such, other values of attenuation are envisioned.

Similarly, in another embodiment, output 416 may be coupled to a plurality of RF MEMS switches configured to operate as a second step attenuator for the signal if the signal is in the second portion of the frequency spectrum. Each RF MEM switch may be associated with a respective step attenuator. Thus, output 416 may be coupled to RF MEMS step attenuator 430. RF MEMS step attenuator 430 may include a plurality of RF MEMS switches, such as RF MEMS switches 432a to 432n. Accordingly, the plurality of RF MEMS switches may operate as the second step attenuator for the signal if the signal is in the low portion of the frequency spectrum. Further, each of the plurality of RF MEMS switches may provide a specified level of attenuation.

Thus, for example, a first RF MEMS switch of the plurality of RF MEMS switches may provide approximately 10 decibels (dB) of attenuation. Similarly, a second and third RF MEMS switch may also each provide approximately 10 dB of attenuation. Further, a fourth RF MEMS switch may provide approximately 5 dB of attenuation. Each RF MEMS switch may operate as a SPDT switch, therefore, each RF MEMS switch has two paths—an on through-line path providing no attenuation and a path through an associated fixed attenuator providing the approximate level of attenuation specified. Thus, in this example, the plurality of pin-diode switches may be programmable to provide between approximately 5 dB and approximately 35 dB of attenuation in approximately 5 dB increments. In other words, the path of the signal through the sequence of switches may be configured such that a specified, or first, level of attenuation may be approximately achieved. Note that in certain embodiments, the plurality of pin-diode switches and the plurality of RF MEMS switches may each be programmed to provide a first level of attenuation. In other words, the plurality of pin-diode switches and the plurality of RF MEMS switches may each be programmed to provide the same level of attenuation. Note, these values are exemplary only, and as such, other values of attenuation are envisioned.

In certain embodiments, a relay may be coupled between output 416 and RF MEMS step attenuator 430. The relay may be configured to protect the plurality of RF MEMS switches and avoid hot switching of the plurality of RF MEMS switches, thus prolonging the useful life of the plurality of RF MEMS switches. In other embodiments, an ESD protection device may be coupled between output 416 and RF MEMS step attenuator 430. The ESD may be configured to protect the plurality of RF MEMS switches from electrostatic discharge, thus prolonging the useful life of the plurality of RF MEMS switches. In some embodiments, both a relay and an ESD protection device may be coupled between output 416 and RF MEMS step attenuator 430. Additionally, in certain embodiments, the crossover frequency may be chosen such that the majority of the ESD energy may be directed to the ESD protection device thereby protecting the entire system from ESD.

Diplexer 440 may include inputs 444 and 446 and output 442. Input 444 may be coupled to a first step attenuator, such as pin-diode step attenuator 420. Similarly, input 446 may be coupled to a second step attenuator, such as RF MEMS step attenuator 430. Accordingly, in certain embodiments, diplexer 440 may be configured to output a step attenuated signal from either the first or second portion of the frequency spectrum. In other words, diplexer 440 may be configured to output a step attenuated signal attenuated by pin-diode step attenuator 420 if the signal is in the first portion of the frequency spectrum or a step attenuated signal attenuated by RF MEMS step attenuator 430 if the signal is in the second portion of the frequency spectrum.

Figure 5:
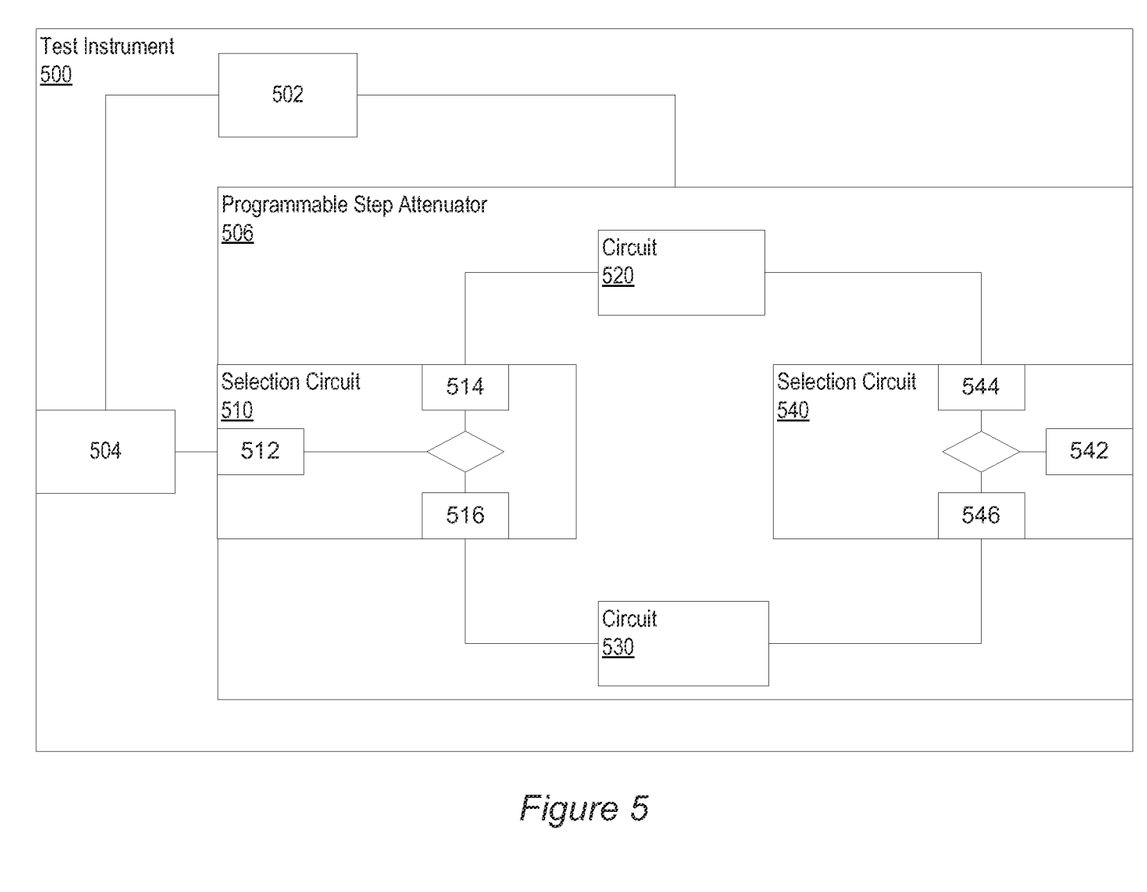
FIG. 5 is a high level block diagram of an exemplary test instrument according to one embodiment of the present invention.

FIG. 5—High Level Block Diagram of a Test Instrument

FIG. 5 is a high level block diagram of a test instrument according to an embodiment of the present invention. Test instrument 500 may include a functional unit 502, a signal receiver 504, and a programmable step attenuator 506. Note that the term functional unit, or processing element, refers to various elements or combinations of elements. Processing elements include, for example, circuits such as an ASIC (Application Specific Integrated Circuit), portions or circuits of individual processor cores, entire processor cores, individual processors, programmable hardware devices such as a field programmable gate array (FPGA), and/or larger portions of systems that include multiple processors, as well as any combinations thereof. Functional unit 502 may be coupled to signal receiver 504 and programmable step attenuator 506. Programmable step attenuator 506 may be similar to programmable step attenuators 200 and 300 fully described above. Further, signal receiver 504 may be coupled to programmable step attenuator 506 and may be configured receive a signal, or signals, from a DUT, such as DUTs 114a-114d of FIGS. 1A and 1B. In some embodiments, signal receiver 504 may be configured to receive a plurality of signals from one or more DUTs and provide each signal to programmable step attenuator 506 for attenuation of each signal. In other words, test instrument 500 may receive multiple signals concurrently or in sequence and then buffer the signals and provide each signal to the programmable step attenuator 506 for attenuation. Additionally, in certain embodiments, test instrument 500 may include a measurement device.

Note that the term measurement device is intended to include instruments, data acquisition devices, smart sensors, and any of various types of devices that are configured to acquire and/or store data. A measurement device may also optionally be further configured to analyze or process the acquired or stored data. Examples of a measurement device include an instrument, such as a traditional stand-alone "box" instrument, a computer-based instrument (instrument on a card) or external instrument, a data acquisition card, a device external to a computer that operates similarly to a data acquisition card, a smart sensor, one or more DAQ or measurement cards or modules in a chassis, an image acquisition device, such as an image acquisition (or machine vision) card (also called a video capture board) or smart camera, a motion control device, a robot having machine vision, and other similar types of devices. Exemplary "stand-alone" instruments include oscilloscopes, multimeters, signal analyzers, arbitrary waveform generators, spectroscopes, and similar measurement, test, or automation instruments.

A measurement device may be further configured to perform control functions, e.g., in response to analysis of the acquired or stored data. For example, the measurement device may send a control signal to an external system, such as a motion control system or to a sensor, in response to particular data. A measurement device may also be configured to perform automation functions, i.e., may receive and analyze data, and issue automation control signals in response.

In one embodiment, programmable step attenuator 506 may include selection circuits 510 and 540 and circuits 520 and 530. Thus, programmable step attenuator 500 may include first and second selection circuitry and first and second circuitry.

Selection circuit 510 (the first selection circuitry) may be configured to receive a signal from signal receiver 504 at input 512. The signal may be of any frequency within the frequency spectrum. In one embodiment, selection circuit 510 may selectively provide the signal to an output based on the frequency of the signal. In other words, the selection circuit 510 may be configured to partition the frequency spectrum into two or more portions and provide the signal to an output corresponding with a portion of the frequency spectrum. Thus, selection circuit 510 may be configured to selectively provide the signal to a first output, such as output 514, if the signal is in a first portion of the frequency spectrum. Similarly, selection circuit 510 may be configured to selectively provide the signal to a second output, such as output 516, if the signal is in a second portion of the frequency spectrum. In other words, in some embodiments, the frequency spectrum may have a first, or high portion, and a second, or low portion.

As illustrated, circuit 520 (the first circuitry) may be coupled to output 514 of selection circuit 510. Thus, in certain embodiments, circuit 520 may receive the signal if the signal is in the first portion of the frequency spectrum. Further, circuit 520 may operate as a step attenuator for the signal and may be configured to provide a step attenuated signal from the first portion of the frequency spectrum.

Similarly, circuit 530 (the second circuitry) may be coupled to output 516 of selection circuit 510. Thus, in certain embodiments, circuit 530 may receive the signal if the signal is in the second portion of the frequency spectrum. Further, circuit 530 may operate as a step attenuator for the signal and may be configured to provide a step attenuated signal from the second portion of the frequency spectrum.

Additionally, selection circuit 540 (the second selection circuitry) may be coupled to circuit 520 via input 544 and circuit 530 via input 546. Selection circuit 540 may be configured to provide at output 542 either a step attenuated signal from the first portion of the frequency spectrum or a step attenuated signal from the second portion of the frequency spectrum.

Further, in certain embodiments, the functional unit 502 may be configured to perform analysis of the step attenuated signal or signals via additional functionality of the test instrument. Alternatively, the functional unit 502 may be configured to transmit the stepped attenuated signal or signals to another functional unit or computer system for analysis.

In certain embodiments, as described in more detail above in reference to FIG. 3, selection circuits 510 and 530 may each include a diplexer where the diplexer is configured to selectively provide the signal to a first output if the signal is in the first portion of the frequency spectrum and a second output if the signal is in the second portion of the frequency spectrum. Additionally, in an exemplary embodiment, circuit 530 may include a pin-diode based step attenuator configured to attenuate the signal if the signal is in the first portion of the frequency spectrum. Further, circuit 540 may include an RF MEMS based step attenuator configured to attenuate the signal if the signal in in the second portion of the frequency spectrum. In some embodiments, the second circuitry, e.g., circuit 530 may include protection for the RF MEMS based step attenuator such as a relay, an ESD protection device, or both.

Figure 6:
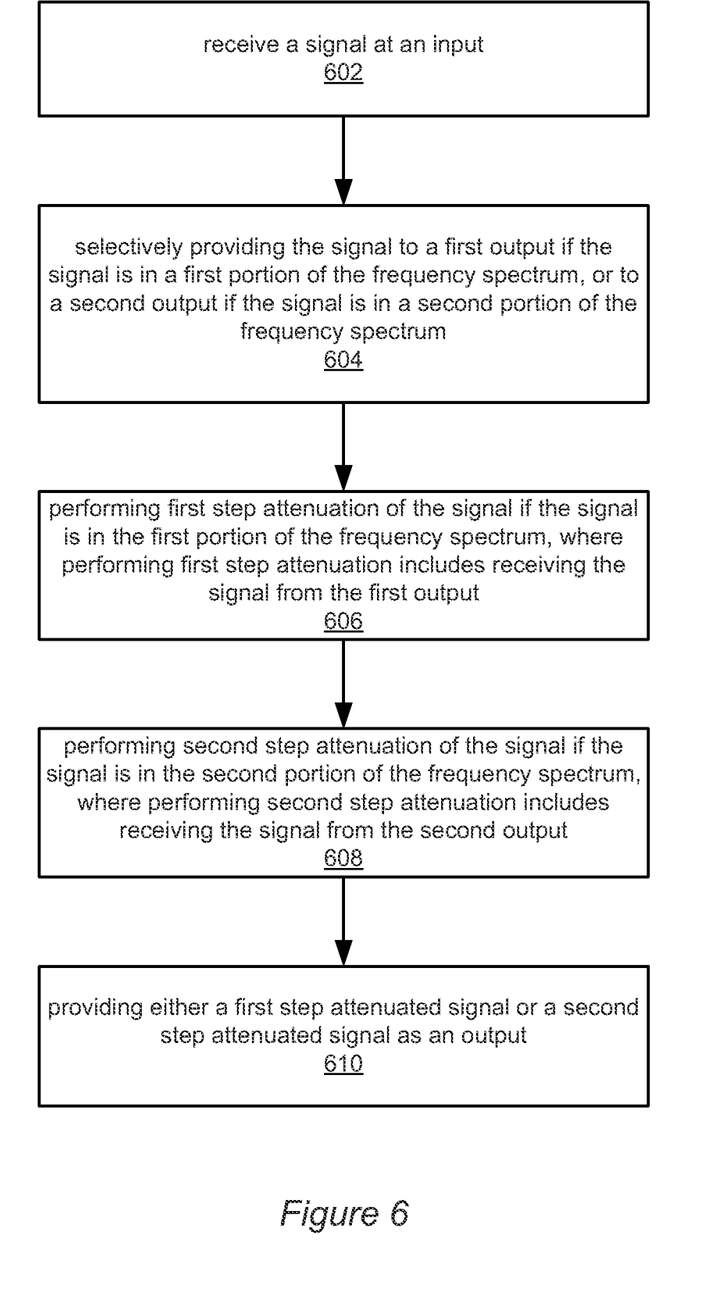
FIG. 6 is a flowchart diagram illustrating one embodiment of a method for step attenuating signals.

FIG. 6—Flowchart of a Method for Attenuating a Signal

FIG. 6 illustrates a method for attenuating a signal. The method shown in FIG. 6 may be used in conjunction with any of the test instruments or devices, e.g., programmable step attenuators 200 and 300, shown in the above Figures, among other devices. In various embodiments, some of the method elements shown may be performed concurrently, in a different order than shown, or may be omitted. Additional method elements may also be performed as desired. As shown, this method may operate as follows.

First, in 602, a signal may be received at an input. The signal may have a frequency within the frequency spectrum. In certain embodiments, the signal may be provided to the input via a signal receiver.

In 604, the signal may be selectively provided to a first output if the signal is in a first portion of the frequency spectrum. Alternatively, the signal may be provided to a second output if the signal is in a second portion of the frequency spectrum. In certain embodiments, the first portion of the frequency spectrum may include a high portion of the frequency spectrum. For example, in one embodiment, the high portion may include frequencies above 60 MHz. Further, the second portion of the frequency spectrum may include a low portion of the frequency spectrum. For example in one embodiment, the low portion may include frequencies below 60 MHz.

In an exemplary embodiment, selectively providing the signal may include selectively providing, by a diplexer, the signal to the first output if the signal is in the first portion of the frequency spectrum. Further, selectively providing the signal may include selectively providing, by the diplexer, the signal to the second output if the signal is in the second portion of the frequency spectrum.

In 606, first step attenuation of the signal may be performed if the signal is in the first portion of the frequency spectrum. In some embodiments, performing first step attenuation may include receiving the signal from the first output. Accordingly, performing the first step attenuation may attenuate the signal if the signal is in a high portion of the frequency spectrum. Further, in an exemplary embodiment, performing first step attenuation may also include using a plurality of pin-diode switches to perform the first step attenuation.

In 608, second step attenuation of the signal may be performed if the signal is in the second portion of the frequency spectrum. In some embodiments, performing second step attenuation may include receiving the signal from the second output. Accordingly, performing the second step attenuation may attenuate the signal if the signal is in a low portion of the frequency spectrum. Further, in an exemplary embodiment, performing second step attenuation may also include using a plurality of RF MEMS switches to perform the second step attenuation. Additionally, in some embodiments, performing second step attenuation may also include protecting the plurality of RF MEMS switches using a relay, an ESD protection device, or both.

In 610, either a first step attenuated signal or a second step attenuated signal may be provided as an output. In one embodiment, providing step attenuated signals may include receiving, by a diplexer, the first step attenuated signal at a first input of the diplexer or the second step attenuated signal at a second input of the diplexer. Further, the either the first step attenuated signal or the second step attenuated signal may be provided by the diplexer at an output of the diplexer.

Figure 7A:
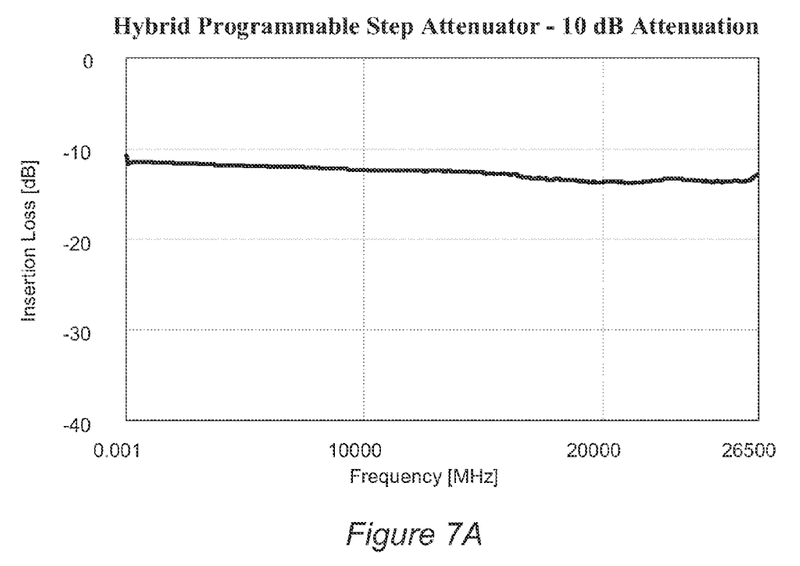
FIGS. 7A and 7B illustrate exemplary results of signals attenuated by a modeled step attenuator according to embodiments of the present invention.
Figure 7B:
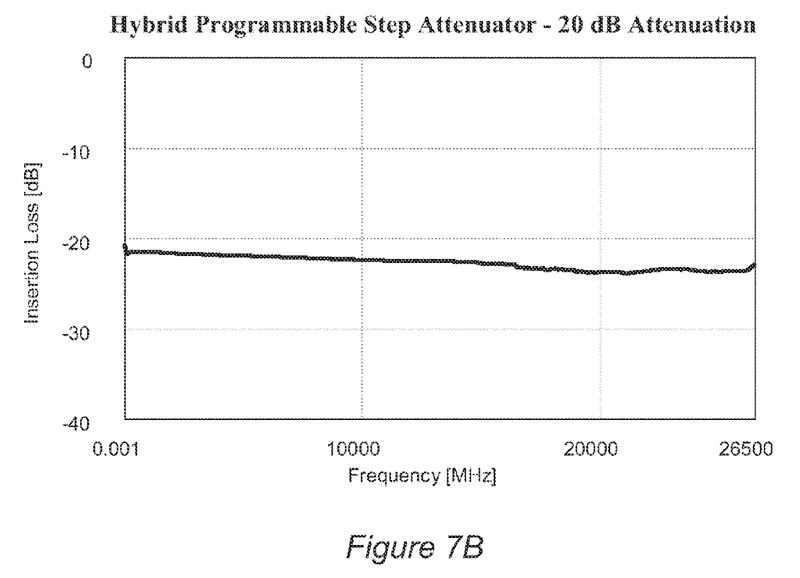

FIGS. 7A and 7B—Exemplary Model Results

FIGS. 7A and 7B are exemplary graphs of Insertion Loss vs. Signal Frequency as generated by a simulation of an exemplary programmable step attenuator according to embodiments of the present invention. The exemplary programmable step attenuator is similar to programmable step attenuator 300 and includes a diplexer with a crossover frequency of approximately 60 MHz, a pin-diode step attenuator with a functional bandwidth of approximately 50 MHz to approximately 70 GHz, and an RF MEMS step attenuator a functional bandwidth of DC to approximately 1 GHz. In FIG. 7A, the simulated exemplary programmable step attenuator was programmed to provide 10 dB of attenuation. In FIG. 7B, the simulated exemplary programmable step attenuator was programmed to provide 20 dB of attenuation. FIGS. 7A and 7B were generated by simulating passing signals of various frequencies ranging from DC to 26.5 GHz through the simulated exemplary step attenuator and calculating insertion loss. Thus, signals with frequencies below 60 MHz were attenuated using the simulated RF MEMS based step attenuator whereas signals with frequencies above 60 MHz were attenuated using the simulated pin-diode based step attenuator. As can be seen from both Figures, the insertion loss across a broad range of the frequency spectrum is resonance free and flat.

It should further be noted that the various terms or designations for circuits/components and signals as they appear herein, for example in such expressions as "first circuitry", "first portion", "second portion", "second selection circuitry", etc. are merely names or identifiers used to distinguish among the different circuits/components and/or between different signals, currents, voltages, etc., and these identifying terms are not intended to connote any specific meaning, unless explicitly noted otherwise.

Although the embodiments above have been described in considerable detail, numerous variations and modifications will become apparent to those skilled in the art once the above disclosure is fully appreciated. It is intended that the following claims be interpreted to embrace all such variations and modifications.

We claim:

1. A programmable step attenuator, comprising:
 a first diplexer, wherein the first diplexer comprises an input, a first output and a second output, wherein the first diplexer is configured to:
  receive a signal at the input;
  selectively provide the signal to the first output if the signal is in a first portion of the frequency spectrum; and
  selectively provide the signal to the second output if the signal is in a second portion of the frequency spectrum;
 a plurality of pin-diode switches coupled to the first output of the first diplexer, wherein the plurality of pin-diode switches operate as a first step attenuator for the signal if the signal is in the first portion of the frequency spectrum;
 a plurality of radio frequency (RF) micro-electro-mechanical system (MEMS) switches, coupled to the second output of the first diplexer, wherein the plurality of RF MEMS switches operate as a second step attenuator for the signal if the signal is in the second portion of the frequency spectrum; and a second diplexer comprising a first input, a second input, and an output, wherein the first input is coupled to the first step attenuator, and wherein the second input is coupled to the second step attenuator, wherein the second diplexer is configured to output a step attenuated signal from either the first or second portion of the frequency spectrum.

2. The programmable step attenuator of claim 1, further comprising:
a relay coupled between the second output of the first diplexer and the plurality of RF MEMS switches, wherein the relay is configured to protect the plurality of RF MEMS switches.

3. The programmable step attenuator of claim 1, further comprising:
an electrostatic discharge (ESD) protection device coupled between the second output of the first diplexer and the plurality of RF MEMS switches, wherein the ESD protection device is configured to protect the programmable step attenuator.

4. The programmable step attenuator of claim 1,
wherein the plurality of pin-diode switches operate as the first step attenuator for the signal if the signal is in a high portion of the frequency spectrum;
wherein the plurality of RF MEMS switches operate as the second step attenuator for the signal if the signal is in a low portion of the frequency spectrum.

5. The programmable step attenuator of claim 1,
wherein the first portion of the frequency spectrum comprises frequencies above 60 Megahertz, wherein the second portion comprises frequencies below 60 Megahertz.

6. The programmable step attenuator of claim 1,
wherein the first and second step attenuators are programmable to provide a first level of attenuation.

7. A method for attenuating a signal, comprising:
receiving a signal at an input;
selectively providing the signal to a first output if the signal is in a first portion of the frequency spectrum, or to a second output if the signal is in a second portion of the frequency spectrum;
performing first step attenuation of the signal if the signal is in the first portion of the frequency spectrum, wherein said performing first step attenuation comprises receiving the signal from the first output;
performing second step attenuation of the signal if the signal is in the second portion of the frequency spectrum, wherein said performing second step attenuation comprises receiving the signal from the second output;
providing either a first step attenuated signal or a second step attenuated signal as an output.

8. The method of claim 7, wherein said selectively providing the signal comprises:
selectively providing, by a diplexer, the signal to the first output if the signal is in the first portion of the frequency spectrum; and
selectively providing, by the diplexer, the signal to the second output if the signal is in the second portion of the frequency spectrum.

9. The method of claim 7, wherein said performing first step attenuation further comprises:
performing the first step attenuation using a plurality of pin-diode switches.

10. The method of claim 7, wherein said performing second step attenuation further comprises:
performing the second step attenuation using a plurality of radio frequency (RF) micro-electro-mechanical system (MEMS) switches.

11. The method of claim 10, wherein said performing second step attenuation further comprises:
protecting, by a relay, the plurality of RF MEMS switches.

12. The method of claim 7, wherein said performing second step attenuation further comprises:
absorbing, by an electrostatic discharge (ESD) protection device, electrostatic discharge.

13. The method of claim 7, wherein said providing step attenuated signals comprises:
receiving, by a diplexer, the first step attenuated signal at a first input of the diplexer or the second step attenuated signal at a second input of the diplexer; and
providing, by a diplexer, either the first step attenuated signal or the second step attenuated signal at an output of the diplexer.

14. The method of claim 7,
wherein said performing the first step attenuation attenuates the signal if the signal is in a high portion of the frequency spectrum;
wherein said performing the second step attenuation attenuates the signal if the signal is in a low portion of the frequency spectrum.

15. A programmable step attenuator, comprising:
first selection circuitry configured to:
receive a signal at an input;
selectively provide the signal to a first output of a plurality of outputs if the signal is in a first portion of a plurality of portions of the frequency spectrum; and
selectively provide the signal to a second output of a plurality of outputs if the signal is in a second portion of the plurality of portions of the frequency spectrum;
first circuitry coupled to the first output of the first selection circuitry, wherein the first circuitry operates as a first step attenuator for the signal if the signal is in the first portion of the frequency spectrum;
second circuitry coupled to the second output of the first selection circuitry, wherein the second circuitry operates as a second step attenuator for the signal if the signal is in the second portion of the frequency spectrum; and
second selection circuitry coupled to the first circuitry and the second circuitry, wherein the second selection circuitry is configured to provide either a step attenuated signal from the first portion of the frequency spectrum or a step attenuated signal from the second portion of the frequency spectrum.

16. The programmable step attenuator of claim 15, wherein the first circuitry comprises:
a plurality of pin-diode switches, wherein the plurality of pin-diode switches operate as the first step attenuator for the signal if the signal is in the first portion of the frequency spectrum.

17. The programmable step attenuator of claim 15, wherein the second circuitry comprises:
a plurality of radio frequency (RF) micro-electro-mechanical system (MEMS) switches, wherein the plurality of RF MEMS switches operate as the second step attenuator for the signal if the signal is in the second portion of the frequency spectrum.

18. The programmable step attenuator of claim 17, wherein the second circuitry further comprises:

a relay, wherein the relay is configured to protect the plurality of RF MEMS switches.

19. The programmable step attenuator of claim 15, wherein the second circuitry further comprises:
an electrostatic discharge (ESD) protection device, wherein the ESD protection device is configured to protect the first and second circuitry.

20. A test instrument, comprising:
a functional unit;
a signal receiver coupled to the functional unit; and
a programmable step attenuator coupled to the signal receiver and the functional unit, wherein the programmable step attenuator comprises:
first selection circuitry configured to:
receive a signal at an input;
selectively provide the signal to a first output if the signal is in a first portion of the frequency spectrum; and
selectively provide the signal to a second output if the signal is in a second portion of the frequency spectrum;
first circuitry coupled to the first output of the first selection circuitry, wherein the first circuitry operates as a first step attenuator for the signal if the signal is in the first portion of the frequency spectrum;
second circuitry coupled to the second output of the first selection circuitry, wherein the second circuitry operates as a second step attenuator for the signal if the signal is in the second portion of the frequency spectrum; and
second selection circuitry coupled to the first circuitry and the second circuitry, wherein the second selection circuitry is configured to provide either a step attenuated signal from the first portion of the frequency spectrum or a step attenuated signal from the second portion of the frequency spectrum; and
wherein the functional unit is configured to:
analyze the stepped attenuated signal; or
transmit the stepped attenuated signal to another functional unit for analysis.

21. The test instrument of claim 20, wherein the first circuitry comprises:
a plurality of pin-diode switches, wherein the plurality of pin-diode switches operate as the first step attenuator for the signal if the signal is in the first portion of the frequency spectrum.

22. The test instrument of claim 20, wherein the second circuitry comprises:
a plurality of radio frequency (RF) micro-electro-mechanical system (MEMS) switches, wherein the plurality of RF MEMS switches operate as the second step attenuator for the signal if the signal is in the second portion of the frequency spectrum.

23. The test instrument of claim 22, wherein the second circuitry further comprises:
a relay, wherein the relay is configured to protect the plurality of RF MEMS switches.

24. The test instrument of claim 20, wherein the second circuitry further comprises:
an electrostatic discharge (ESD) protection device, wherein the ESD protection device is configured to protect second circuitry.

25. An apparatus, comprising:
a plurality of pin-diode switches in communication with a first output of the first diplexer and a first input of a second diplexer, wherein the plurality of pin-diode switches are configured to:
operate as a first step attenuator for a signal received from the first diplexer if the signal is in the first portion of the frequency spectrum; and
provide a step attenuated signal to the first input of the second diplexer; and
a plurality of radio frequency (RF) micro-electro-mechanical system (MEMS) switches, in communication with a second output of the first diplexer and a second input of a first diplexer, wherein the plurality of RF MEMS switches are configured to:
operate as a second step attenuator for a signal received from the first diplexer if the signal is in the second portion of the frequency spectrum; and
proved a step attenuated signal to the second input of the second diplexer.

26. The apparatus of claim 25, wherein the first portion of the frequency spectrum comprises frequencies above 60 Megahertz, wherein the second portion comprises frequencies below 60 Megahertz.

* * * * *